(12) United States Patent
Capote et al.

(10) Patent No.: US 6,616,984 B1
(45) Date of Patent: Sep. 9, 2003

(54) FORMING VIAHOLES IN COMPOSITION OF CYANATE, BISMALEIMIDE, EPOXY RESIN AND UNSATURATED AROMATIC GLYCIDYL

(75) Inventors: Miguel Albert Capote, 4600 Park Dr., Carlsbad, CA (US) 92008; Edward S. Harrison, Idylwild, CA (US); Yong-Joon Lee, Oceanside, CA (US); Howard A. Lenos, Murrieta, CA (US)

(73) Assignee: Miguel Albert Capote, Carlsbad, CA (US)

( * ) Notice: Subject to any disclaimer, the term of this patent is extended or adjusted under 35 U.S.C. 154(b) by 0 days.

(21) Appl. No.: 09/907,014

(22) Filed: Jul. 16, 2001

Related U.S. Application Data (60) Division of application No. 09/346,001, filed on Jun. 30, 1999, now abandoned, which is a continuation-in-part of application No. 08/949,204, filed on Oct. 10, 1997, now abandoned, and a continuation-in-part of application No. 08/949,214, filed on Oct. 10, 1997, now abandoned.
(60) Provisional application No. 60/135,356, filed on May 21, 1999.

(51) Int. Cl.[7] .................. A32B 31/28; C08L 63/00; C08J 7/04

(52) U.S. Cl. .................. 427/510; 427/504; 522/36; 522/111; 522/117; 428/901; 525/423; 525/426; 525/471; 525/481; 525/524; 525/530; 525/533

(58) Field of Search .................. 428/901; 438/127; 525/423, 426, 471, 481, 530, 533, 524; 528/113, 119, 120; 427/504, 510; 522/36, 111, 117

(56) References Cited

U.S. PATENT DOCUMENTS

| | | |
|---|---|---|
| 3,681,292 A | 8/1972 | Loudas et al. |
| 4,110,364 A | 8/1978 | Gaku et al. .................. 528/170 |
| 4,130,600 A | 12/1978 | Zahir et al. .................. 428/415 |
| 4,195,132 A | 3/1980 | Sundermann et al. ....... 525/113 |
| 4,384,129 A | 5/1983 | Zahir et al. .................. 528/101 |
| 4,429,112 A | 1/1984 | Gaku et al. .................. 528/422 |
| 4,477,629 A | 10/1984 | Hefner, Jr. .................. 525/113 |
| 4,487,915 A | 12/1984 | Hefner, Jr. .................. 528/96 |
| 4,496,695 A | 1/1985 | Sugio et al. .................. 525/391 |
| 4,528,366 A | 7/1985 | Woo et al. .................. 528/422 |
| 4,546,131 A | 10/1985 | Hefner, Jr. .................. 525/113 |
| 4,558,115 A | 12/1985 | Hefner, Jr. .................. 525/502 |
| 4,612,359 A | 9/1986 | Hefner, Jr. .................. 525/504 |
| 4,652,619 A | 3/1987 | Nakajima et al. ........... 525/502 |
| 4,696,988 A | 9/1987 | Higashimura et al. ...... 526/220 |
| 4,740,584 A | 4/1988 | Shimp ........................ 528/422 |
| 4,745,215 A | 5/1988 | Cox et al. .................... 528/422 |
| 4,774,282 A | 9/1988 | Qureshi ....................... 525/391 |
| 4,782,116 A | 11/1988 | Holte .......................... 525/113 |
| 4,789,711 A | 12/1988 | Monnier et al. ............. 525/507 |
| 4,831,086 A | 5/1989 | Das et al. .................... 525/504 |
| 4,851,279 A | 7/1989 | Das et al. .................... 525/504 |
| 4,861,823 A | 8/1989 | Qureshi ....................... 528/170 |
| 4,978,727 A | 12/1990 | Das et al. .................... 525/504 |
| 4,988,780 A | 1/1991 | Das et al. .................... 525/504 |
| 4,996,267 A | 2/1991 | Gerth et al. ................. 525/533 |
| 5,004,788 A | 4/1991 | Das et al. .................... 525/504 |
| 5,043,214 A | 8/1991 | Das et al. .................... 525/504 |
| 5,109,078 A | 4/1992 | Das et al. .................... 525/504 |
| 5,137,989 A | 8/1992 | Das ............................. 525/504 |
| 5,167,880 A | 12/1992 | Couch et al. ................ 427/340 |
| 5,179,176 A | 1/1993 | Shiobara et al. ............ 525/502 |
| 5,194,331 A | 3/1993 | Das et al. .................... 525/504 |
| 5,260,121 A | 11/1993 | Gardner et al. ............. 525/504 |
| 5,273,816 A | 12/1993 | Olson et al. ................. 428/272 |
| 5,330,684 A | 7/1994 | Emori et al. ................ 525/438 |
| 5,359,020 A | 10/1994 | Brunner et al. ............. 526/262 |
| 5,464,726 A | 11/1995 | Gelorme et al. ............ 430/326 |
| 5,532,105 A | 7/1996 | Yamadera et al. .......... 430/156 |
| 5,605,781 A | 2/1997 | Gelorme et al. ............ 522/173 |
| 5,606,100 A | 2/1997 | Pfammatter ................. 560/192 |

FOREIGN PATENT DOCUMENTS

| | | |
|---|---|---|
| EP | 0413087 A1 | 2/1991 |
| JP | 55-145766 | 11/1980 |
| JP | 59-218738 | 12/1984 |
| JP | 60-152571 | 8/1985 |
| JP | 61-237436 | 10/1986 |
| JP | 62-285968 | 12/1987 |
| JP | 08-181436 A | * 12/1994 |
| JP | 7-70317 | 3/1995 |
| JP | 7-149893 | 6/1995 |
| WO | WO92/10206 | 6/1992 |
| WO | WO92/21651 | 12/1992 |
| WO | WO95/07309 | 3/1995 |

OTHER PUBLICATIONS

Jap. Publication JP A 1–306405, Nishikawa, published Dec. 10, 1992.

Patterson, W.A., Infrared Absorption Bands Characteristic of the Oxirane Ring, *Analytic Chemistry*, vol. 26, No. 5, 1954.

\* cited by examiner

Primary Examiner—Robert E. L. Sellers
(74) Attorney, Agent, or Firm—Burns, Doane, Swecker & Mathis LLP (57) ABSTRACT

A process of forming vias in a composition comprising
(a) applying a layer of a composition containing (i) a cyanate ester, (ii) a bismaleimide, (iii) a co-curing agent having the structure $R^1$—Ar—$R^2$ wherein Ar is at least one aryl moiety, $R^1$ is at least one unsaturated aliphatic moiety and $R^2$ is at least one glycidyl moiety, (iv) an epoxy resin and, optionally, (v) a free-radical initiator;
(b) covering the layer with a mask having windows through which radiation can be transmitted;
(c) exposing part of the composition to radiation to at least partially cure it in the exposed areas;
(d) removing the non-cured portions of the composition; and
(e) completing the cure of the resin compositions.

24 Claims, 8 Drawing Sheets

FORMING VIAHOLES IN COMPOSITION OF CYANATE, BISMALEIMIDE, EPOXY RESIN AND UNSATURATED AROMATIC GLYCIDYL

CROSS REFERENCE TO RELATED APPLICATIONS

This application is a divisional of application Ser. No. 09/346,001, filed on Jun. 30, 1999, abandoned, which is a continuation-in-part of U.S. application Ser. Nos. 08/949, 204, filed on Oct. 10, 1997, abandoned, and 08/949,214, filed on Oct. 10, 1997, abandoned, which are incorporated by reference. This CIP also claims priority to U.S. Provisional Application Ser. No. 60/135,356, filed on May 21, 1999, which is also incorporated herein by reference.

The U.S. Government has a paid-up license in this invention and the right in limited circumstances to require the patent owner to license others on reasonable terms as provided for by the terms of contract no. DASG 60-97-M-0072 awarded by Ballistic Missile Defense Organization.

FIELD OF THE INVENTION

This invention relates generally to printed circuits or encapsulated electronics devices, such a silicon chips, coated with curable resin compositions comprising epoxy resins, cyanate esters, bismaleimides, and a co-curing agent.

BACKGROUND OF THE INVENTION

The fabrication of electronic printed circuits often requires the fabrication of very fine electrical interconnections, that are as small as 50 microns in diameter, through a dielectric resin. This technology is generally known as microvia technology. Also, in the fabrication of flip chips, ball grid arrays (BGAs) and chip-scale packages, it is necessary to create electrical interconnections in the form of tiny balls or joints with solders or other electrically conductive substances. Generally the electrical interconnections are encapsulated in a non-conductive permanent resin. The properties of the resin chosen for microvia and encapsulated interconnections are critical to the reliability to the electrical device. A number of resins have been used for such applications, such as epoxy resins, acrylates, cyanate esters and bismaleimide-triazine-epoxy resins.

Epoxy resins, which represent some of the most widely used resins, are characterized by easy processability, good adhesion to various substrates, high chemical and corrosion resistance, and excellent mechanical properties. However, epoxy resins have relatively poor performance at high temperatures, have high dielectric constants, and exhibit significant water absorption. Epoxy resins are generally cured by amines and anhydrides. The cured materials typically contain relatively large proportions of hydrophilic groups such as hydroxyl groups which increase water absorption. Epoxy resins thus are sensitive to hydrolysis at high temperature and high humidity. Moreover, the chemical resistance of epoxy resin is not as good as that of cyanate esters and bismaleimides.

Cyanate ester resins have improved performance relative to conventionally cured epoxy resins. Polyfunctional cyanate esters are normally needed to achieve high crosslinking densities and high glass transition temperatures (Tg). Unfortunately, polyfunctional cyanate esters are typically solid or semi-solid at ambient temperatures and thus the formulated resin systems have relatively high viscosities. These resin systems often require significant amounts of solvents.

Another leading thermosetting resin is bismaleimide which is characterized by excellent physical property retention at high temperatures and high humidities and stable (non-fluctuating) electrical properties over a wide temperature range. These properties make bismaleimide particularly suitable for advanced composites and electronics. Bismaleimides are capable of good performance at temperatures of up to about 230° C. to 250° C. with good hot-wet performance. However, bismaleimide homopolymers are brittle and as a result are susceptible to microcracking. Moreover, the chemical resistance of bismaleimides is poor in the presence of base compounds. Generally, bismaleimide is combined with cyanate ester to create a resin class generally known as BT resins. These resins provide improved glass transition temperature performance and other improved properties as compared to epoxy resins. They are also less expensive than cyanate ester resins. However, the mixture of cyanate esters and bismaleimides exhibits little co-polymerization, therefore, the combination has inferior properties compared to pure cyanate ester or bismaleimide resins.

The art is in need of thermosetting resins demonstrating both high temperature performance and improved physical toughness, especially for microvia and encapsulated electrical interconnect electronics applications, such as printed circuits, flip chips, BGAs and chip scale packages.

SUMMARY OF THE INVENTION

This invention relates to a resin system comprising a mixture of epoxy resins, bismaleimides, cyanate esters and low viscosity co-curing agents that can be applied to a printed circuit, a silicon chip or wafer, or other electronic component, encapsulating it with a dielectric. Openings can be created in the encapsulating resin by conventional methods such as laser drilling, photoimaging, plasma, or other techniques known in the art. These openings can be metallized to form highly reliable electrical interconnections. The inventive resin system demonstrates the excellent processability, adhesion, chemical and corrosion resistances, and mechanical qualities normally associated with epoxy resins; the system also exhibits superior physical and chemical properties as well as the stable electrical properties associated with bismaleimides and cyanate esters. All of these are highly desirable characteristics for encapsulants, microvia and interconnection applications.

In one aspect the invention is directed to a curable composition that includes:
(a) a cyanate ester;
(b) a bismaleimide;
(c) a co-curing agent having the structure $R^1$—Ar—$R^2$ wherein Ar is at least one aryl moiety, $R^1$ is at least one unsaturated
(d) an epoxy resin;
(e) optionally, a free-radical initiator; and
(f) optionally, a cyanate ester trimerization catalyst.

Preferred curing agents are 2-allylphenyl glycidyl ether and 2,2'-bis (3-ally-4-glycidoxy phenyl) isopropylidene, hereinafter referred to as 2,2'-diallylbisphenol A diglycidyl ether.

The co-curing agent reacts with the cyanate ester, epoxy resin and bismaleimide. The viscosity of the co-curing agent is low enough at room temperature so that no solvent is generally necessary. The crosslinking density of the cured composition can be varied over a wide range by adjusting the relative proportions of each component in the resin mixture.

The invention is based in part on the integration of (i) a glycidyl group, which is reactive with cyanate ester, and (ii) an unsaturated aliphatic group such as an allyl group, which is reactive to bismaleimide, into a co-curing agent molecule. The presence of this co-curing agent in the inventive resin system not only makes it possible to co-cure cyanate ester and bismaleimide, in addition, it reduces the viscosity of the resin system because of the low viscosity of the co-curing agent. Furthermore, the combination of epoxy resin with the cyanate ester by means of well-established curing reactions produces a cured composition with the before mentioned desirable properties. For example, the thermal stability, high temperature performance and hot-wet resistance of the cured inventive resin system are superior to those of conventional amine and anhydride cured epoxy resins. In addition, the uncured resin exhibits excellent processability while the cured resin system demonstrates toughness and chemical resistance that are superior to those from bismaleimide or cyanate ester homopolymers.

DETAILED DESCRIPTION OF THE INVENTION

The present invention is based in part on the development of a resin system comprising cyanate ester resins, bismaleimides, co-curing agents and epoxy resins. The co-curing agent comprises two different reactive groups: (i) a moiety having an unsaturated aliphatic group capable of reacting with bismaleimides, e.g., an allyl group, and (ii) a glycidyl ether, that is capable of reacting with cyanate esters. The physical properties of the pre and post cured inventive resin system can be varied by employing different proportions of cyanate esters, epoxy resins, bismaleimides, and co-curing agents. Advantageous characteristics of the inventive resin system include, for example:

1. Processability that is comparable to epoxy resins and cures upon heating, with the cured product overall performing better than either cyanate esters, epoxy resins or bismaleimides individually.

2. Good thermal stability, up to about 350° C., and demonstrating glass transition temperatures from 200° C. to 260° C., depending on the proportion of bismaleimides and cyanate esters used in the inventive resin system.

3. No volatiles are evolved from the curing reaction and thus void-free cured compositions are produced.

4. Improved adhesion properties compared to bismaleimides or cyanate esters.

5. The hot-wet performance of the cured composition is much better than that of conventionally cured epoxy resins.

6. The integration of epoxides and carbon-carbon double bonds into the co-curing agent makes the resins polymerizable by light-initiated free-radical catalysts. This will allow creation of encapsulants that can be polymerized by ultra-violet or electron beam exposure, either in bulk or through a mask to produce photodefined features and microvias.

7. Cost effective alternative to prior art epoxy resin, cyanate ester and bismaleimide resins for industrial dielectrics and encapsulants.

Co-curing Agent

The co-curing agent has the structure $R^1$—Ar—$R^2$ where Ar comprises is at least one aryl moiety, $R^1$ is at least one unsaturated aliphatic moiety and $R^2$ is at least one glycidyl ether moiety. Ar preferably has one aryl moiety but it is understood that it can comprise multiple aromatic moieties linked linearly (e.g. a novolac), or by branching (e.g. triphenyl, tetraphenyl). Preferably each aryl moiety has at least one of (i) an unsaturated aliphatic moiety and (ii) a glycidyl moiety attached thereto, with the proviso that the co-curing has at least one of each moiety. The number of aromatic moieties in Ar is typically less than about 3. When more than one aryl moiety is present, they are linked by suitable divalent groups such as, for example, a low alklylene, —$(CH_2)_n$— where n is 1–6, preferably 1–3, and more preferably 1. The term "aryl" refers to an unsaturated aromatic carbocyclic group of 6 to 14 carbon atoms having a single ring (e.g., phenyl) or multiple condensed rings (e.g., naphthyl or anthryl). Preferred aryls include phenyl, naphthyl and the like. Preferred co-curing agents have structure I or II:

where each of $R^3$ and $R^4$ is preferably H, $CH_3$ or $CF_3$. Both structures can be further substituted with, for example, lower alkyls having preferably 1–6 carbons more, preferably 1–3 carbons and halides Cl, Br or F. Particularly preferred co-curing agents are 2-allylphenyl glycidyl ether (APGE), and 2,2'-diallylbisphenol A diglycidyl ether (DADE) which have the following structures III and IV, respectively:

III

IV where x is any suitable divalent moiety, such as —O—, a lower alkylene —(CH$_2$)$_m$— where m is 1–6, preferably 1–3, and most preferably 1, —CH$_3$CH$_2$—, —CH$_3$CH$_3$CH$_2$—, or other functional divalent group. A preferred polyfunctional cyanate ester used for its superior dielectric properties is:

APGE and DADE can be synthesized in accordance with the following well-established reaction mechanism:

where n is an integer from 0 to 200 and preferably from 0 to 1. Typically in commercial resins n has an average value of about 0.4. The polyfunctional cyanate serves to increase the density of cured resin composition. The polyfunctional cyanates react with the epoxy resin and the epoxide group in the co-curing agent thereby forming crosslinked polymeric networks. Polyfunctional cyanate esters are typically solid at ambient temperatures (25° C.) but dissolve readily in the co-curing agent and the epoxy resin, although some warming may be needed to bring about solution.

Epoxy Resins

Suitable epoxy resins include any of a variety of polyfunctional epoxy resins that are known or commercially available. Suitable epoxy resins are described, for example, in U.S. Pat. No. 5,464,726, which is incorporated herein. Preferred commercially available epoxy resins include, for example, bisphenol A epoxy resins, e.g. Shell EPON 800 series, bisphenol F, epoxy novolac, epoxy cresol novolac, N,N-diglycidyl4-glycidoxyaniline, and 4,4'-methylenebis (N,N-diglycidylaniline). Other exemplary commercially available epoxy resins are available as Dow Tactix 742, Shell RSL-1107, EPON 825, EPON 828, EPON 1031, SU-3, SU-8, and Ciba-Geigy Araldite LT8011, LT8052, LT8047, CY8043, CY179, and Dow DEN438 and DEN 439.

Cyanate Esters

Suitable cyanate esters are polyfunctional molecules or oligomers having at least two -OCN groups. Cyanate esters are self reactive and also cure in the presence of epoxy resin or bismaleimide. Suitable polyfunctional cyanate esters are described, for example, in U.S. Pat. Nos. 4,831,086, 5,464, 726, 4,195,132, 3,681,292, 4,740,584, 4,745,215, 4,776,629 and 4,546,131, which are incorporated herein. Preferred polyfunctional cyanate esters include the following:

Bismaleimides

The generalized structure of bismaleimide is:

where R is any suitable divalent functional moiety such as, e.g., a lower alkylene —$(CHz)_m$—, where m is 1–6, preferably 1–3, and most preferably 1. A preferred divalent functional moiety is:

Suitable bismaleimides are further described, for example, in U.S. Pat. No. 5,464,726 and 4,978,727, which are incorporated herein. A preferred bismaleimide is MDA Bismaleimide Resin 5292A from Ciba Geigy.

Free Radical Initiators

There are two preferred types of free radical initiators: heat triggered initiators and energetically-triggered initiators. Examples of heat triggered initiators are lauryl peroxide and tert-butyl peroxide. Heat triggered initiators operate by decomposing at the trigger temperature, thereby creating free radicals as follows:

The free radicals then initiate chain growth polymerization of the unsaturated bonds in the bismaleimide and the co-curing agent, as illustrated by the following example reaction:

The newly formed free radical continues the chain reation.

Similarly, energetically-triggered initiators also produce free radicals which initiate the chain growth polymerization of unsaturated bonds in the bismaleimide and the co-curing agent. However, these are triggered by actions of energetic photons generated by radiation, as from an ultraviolet light source, or electrons, as from a plasma or electron beam, instead of by heat.

Typically, the free radical initiator agent, when employed, comprises about 0.1% to 3%, preferably 0.1% to 2% and more preferably 0.5% to 1.5% by weight of the curable composition.

Polymerization

Cyanate esters can homopolymerize to produce symmetrical aryl cyanurate rings:

where Ar groups are aryl groups. Cyanate esters and epoxides co-polymerize through a complex series of rearrangement and substitution reactions, forming heterocyclic 5- or 6-membered rings. Specific examples include oxazoline rings and oxazolidinone rings:

where and where Ar' and Ar" are aromatic groups resulting in good thermal stability and improved moisture and chemical resistance.

Bismaleimides are known to free-radical polymerize with heat, with or without the presence of free radical initiators, as follows:

The reactions between a maleimide group and an allyl-substituted benzene is also well known—the Ene reaction and subsequent Diels-Alder reactions, as illustrated as follows:

The above reactions demonstrate that compounds having an aromatic ring structure that have an allyl group and an epoxide group attached thereto are effective co-polymerizers for both cyanate esters and bismaleimides, to form numerous cycloaliphatic polymers. These polymers are quite stable against water and other chemicals, mechanically tough and resistant to high temperature decomposition. Important characteristics afforded by the degree of crosslinking in the polymer matrix formed are the low coefficients of thermal expansion and high glass transition temperatures that can be attained. These are essential properties for encapsulants in electronics applications. The absence of hydroxyl groups in the polymer matrix also implies significantly lower dielectric constant for the polymers as compared to conventionally cured epoxy resins.

Incorporating epoxy resins into the polymer also provides for improved adhesion of the polymer to surfaces as compared to pure cyanate esters and/or bismaleimide resins. This combination of improved characteristics—lower dielectric constant, lower thermal expansion, higher glass transition temperature, better toughness, lower water absorption, better chemical resistance, better adhesion and higher decomposition temperature—is essential for producing printed circuitry and encapsulants for silicon and other electronic devices.

Another important characteristic of the co-curing agents is that they are generally very low viscosity liquids at or near room temperature so they function as excellent solvents for the cyanate esters and bismaleimides. Alone, or in combination with liquid epoxy resins, the co-curing agents dissolve the cyanate esters and bismaleimides to form room temperature or hot melt liquid resin mixtures that are completely free of volatile solvents. This is an important property in the fabrication of encapsulants and microvia dielectric layers as it permits creation of liquid pastes and resins that can be applied in relatively thick layers to electronic components in one step and cured without evolution of volatile solvents that create voids.

Although volatile organic solvents are typically not employed, in applications where the presence of volatile organic solvents is not a problem, solvents can be added if desired. Such solvents include, for example methyl ethyl ketone, chloroform, methylene chloride, acetone, and 1-methyl 2-pyrrolidinone.

Another significant advantage of the inventive resin composition is that the addition of free-radical polymerization initiators creates resin systems that can be multistage-cured. This allows application of the resin composition in liquid form, which is subsequently hardened by heat or ultraviolet light. The use of a thermally-initiated, low-temperature triggered free radical initiator, such as lauryl peroxide, allows polymerization to be initiated at a temperature between about 100°–130° C. A resin composition comprising such an initiator can be used to coat an electronic component or circuit board with a liquid encapsulant that is then partially cured by heating to the initiator trigger temperature. This creates a partially polymerized solid, which, though not completely polymerized, will no longer flow like a low-viscosity liquid. Such a resin composition can be applied by screen printing, curtain coating or other method known to one skilled in the art. The coated component or circuit can then be heated rapidly to a temperature at which the free radical polymerization can occur to complete the polymerization.

The use of a pre-cured or partially cured resin composition allows easy post processing by means of laser or plasma etching, two common methods used in the creation of microvias. The low polymerization density of the polymer at this first stage of curing allows very rapid and low-energy laser drilling and plasma etching to occur, thereby greatly speeding up the laser drilling process. This provides substantial advantages in the manufacture of microvia components where speed translates into significant cost and manufacturing advantages.

Another approach to free radical polymerization is to use an ultraviolet sensitive photoinitiator. Instead of heat, radiation (e.g., electrons or ultraviolet light) is used in the first stage of curing and solidifying the liquid resin composition. After this first light-initiated cure, the coated part can be laser or plasma drilled as previously indicated.

The photoinitiator induces a chain reaction or chain growth polymerization of unsaturated carbon-carbon bonds.

This type of curing is effective for achieving a first stage crosslinking for photoimaging. When a layer of material is exposed to the UV light through a mask, it hardens. The mask can be made of any suitable UV blocking/absorbing material with openings through which UV radiation can be transmitted. The non-exposed portions of the resin composition will form the microvias which typically have a diameter of about 20 μm to 200 μm. Any unexposed resin composition can then be dissolved away, leaving the image of the mask. Then the image can be completely hardened with heat. The polymer can be applied in thin coats or layers that can be instantly UV-cured to a gel-set by the UV light initiated reaction. The unexposed resin composition can then be washed away with a suitable solvent. Finally heat is applied to effect a deep and complete cure of the polymer resin.

This gives rise to yet another approach to using free radical polymerization to produce photo-defined microvias. In this case, the resin composition is prepared as a viscous liquid and is then applied to an electronic component or printed circuit board. A very high viscosity composition is preferred since it will remain in place without polymerization while the ultraviolet light is used to image the microvias through a photomask. This selective exposure produces some regions in the resin which are cured partially and other regions which are completely uncured by being masked from the ultraviolet light by the photomask.

Subsequent to exposure to ultraviolet light through the photomask, the coated component or printed circuit board is developed in an aqueous or organic solution of KOH. The developer dissolves the unexposed resin regions away, leaving behind the ultraviolet polymerized portions of the resin on the component or printed circuit board. After development, microvias are present in the resin system. This allows a rapid and inexpensive way to fabricate many microvias at one time using simple photo exposure techniques. Subsequent full hardening of the resin occurs by heating the coated component, with its microvias, to the final curing temperature of the resin to produce a fully polymerized polymer with its final ideal properties. For this reason, a combination of heat and UV is most effective for photo-imaging.

Formulation of Resin Compositions

Both APGE and DADE are liquids at room temperature and easy to formulate with cyanate/epoxy/bismaleimide resins. It should be noted that during storage the components of the resin composition will slowly react. Therefore, the term "epoxy resin" include partial or prepolymers thereof. Similarly, for "bismaleimide, " and "co-curing agent" each term include partial or prepolymers thereof.

In formulating the inventive resin compositions, it is important to recognize that cyanate ester and bismaleimide are each capable of self-polymerization. As a result, the concentrations of cyanate ester and bismaleimide can each vary from 1 to 99% of the molar concentration of the resin composition and still achieve complete polymerization. On the other hand, the epoxy resin which does not self-polymerize, needs the cyanate ester for the reaction to occur. In determining the maximum epoxy resin concentration, it is necessary to account for the epoxide in the co-curing agent as this reactive group also will consume cyanate esters during polymerization. As a result, to achieve substantially full polymerization, the epoxide molar equivalent concentration in the resin composition, which includes the co-curing agent and the epoxy resin, is preferably equal to or less than the cyanate ester molar equivalent concentration. Likewise, since the co-curing agent reacts with the bismaleimide, the co-curing agent concentration is preferably less than the lesser of the cyanate ester or the bismaleimide molar equivalent concentrations. Any resin composition prepared within these "proportional" limitations, will provide a fully polymerized polymer when cured.

To minimize the amount of costly cyanate ester and bismaleimide used without significantly adversely effecting the final properties of the resin composition, for a preferred embodiment of the resin composition, the cyanate ester comprises about 3 to 5 molar equivalent parts of the composition, the epoxy resin comprises 1.5 to 5 molar equivalent parts of the composition, the bismaleimide comprises 0.5 to 1.5 molar equivalent parts of the composition and the co-curing agent 0.5 to 1.5 molar equivalent parts of the composition, subject to the above proportional limitations. It should be noted that the above molar equivalent proportions are based on resin compositions containing no solvents, catalysts, fillers, e.g., silica, or free-radical initiators, which are optional. More preferred are resin compositions comprising these proportions and also comprising 100 to 500 parts per million of cyanate ester weight of a cyanate catalysts such as copper (II) acetyl acetonate.

Particularly, preferred resin compositions are those that are stoichiometrically balanced and which use minimal amounts of co-curing agent and bismaleimide. Subject to the above proportional limitations, preferred resin compositions include 5 to 6 molar equivalent parts cyanate ester, 1.5 to 5 molar equivalent parts epoxy resin, 200 to 400 parts per million of cyanate ester equivalent of a cyanate catalysts such as copper (II) acetyl acetonate catalyst, and 0.75 to 1.25 molar equivalent parts each of bismaleimide and co-curing agent, with the proportions of bismaleimide and co-curing agent being equal.

In formulating the resin composition, the components are mixed and heated in order to melt the bismaleimide and the polyfunctional cyanate ester which are solids. Typically, the mixture is heated to a temperature range of about 70° C. to 115° C. until the mixture is a liquid. If desired, a solvent such as methyl ethyl ketone or acetone can be added to the formulation to facilitate processability.

To insure a homogenous resin composition and to reduce loss of the co-curing agent through evaporation during the cure cycle, the co-curing agent and the bismaleimide monomers can be first pre-reacted. This can be done by stirring the two components under heat at about 115° C. for four or five hours. This pre-reaction causes the allyl in the co-curing agent and the bismaleimide to co-react, forming a light slurry which readily dissolves with the cyanate ester and the epoxy during resin mixing.

The inventive resin composition can be cured by heat. The curing temperature range is from about 100° C. to 250° C., more preferably from 130° C. to 225° C. and most preferably from 150° C. to 220° C. In a preferred method, the system is initially cured at a lower temperature of about 120° C. to 140° C. for about 2 hours and is followed by post curing treatment (at 210° C. to 230° C.) for another hour. The cured resins have high glass transition temperatures ranging from 200° C. to 250° C., depending on the component ratios; and the cured resins also exhibit thermal stability against decomposition to a temperature of at least between 350° C. and 400° C. In addition, the effectively tailored properties from epoxy and bismaleimide include the good adhesion properties, chemical resistance, low water absorption and high heat distortion temperature.

A catalyst for trimerization of the cyanate ester is required. Acetylacetonates of various transition metals, e.g., Cu, Co, Zn, can be employed at very low concentrations, e.g., a few hundred parts per million.

EXAMPLES

Example 1

Synthesis of 2-Allylphenyl Glycidyl Ether

APGE was synthesized from 2-allyl phenol (AP) and epichlorohydrin (EPH) in the presence of aqueous sodium hydroxide at 115° C. under nitrogen. The reaction was optimized by using 10 times excess (molar ratio) of EPH and minimizing water in the reaction. During the reaction, water was produced by the reaction between 2-AP and EPH. Since water and EPH form an azeotrope, water was removed from the reaction by azeotropic distillation, which also drives the reaction forward. Collected EPH was returned as needed to the mixture to prevent undesirable side reactions. After 4 hours, the resultant salts were separated from the product. The product was then purified by extraction of the oil phase with toluene, followed by removal of excess EPH and aqueous phase with toluene, which was also used as an azeotropic agent. The product obtained was a thin, yellowish, transparent liquid. Yield was about 90%. Distillation at low pressure (0.3mm of Hg) yielded a water white mobile liquid with a boiling point of 72–72° C. Atmospheric distillation produced a boiling point of 272–274° C.

Example 2

Synthesis of 2.2'-Diallylbisphenol A Diglycidyl Ether

To synthesize DADE, 2,2'-diallylbisphenol A was added to 20 times excess (molar ratio) epichlorohydrin (EPH). The reaction temperature was raised to about 115° C. under nitrogen and aqueous sodium hydroxide was added slowly. As in the APGE synthesis of Example 1, water was removed from the reaction by azeotropic distillation, which also drives the reaction forward. Collected EPH was returned as needed to the mixture to prevent undesirable side reactions. After the reaction was completed, in 4 hours, the salts were filtered from the product. The product was then purified by extraction of the oil phase with toluene followed by removal of excess EPH and aqueous phase with toluene. The product obtained was yellowish viscous liquid.

FTIR results supported complete reaction and the purity of the products, based on the presence of the peaks at 1234 and 1127 $cm^{-1}$ (ether) and 920 $cm^{-1}$ (allyl) and others. Elemental analysis also confirmed the formation of the products.

Example 3

Cured Resin Composition 1

To demonstrate the effect of the co-curing agent APGE, two resin mixtures, one containing APGE and the other without were tested. The molar equivalent ratios of the two mixtures included:

1. 1 part B-10 cyanate ester resin from Ciba-Geigy.

2. 1 part 1,1-(methylene di-4, 1-phenylene) bismaleimide from Aldrich.

3. (i) 0.2 or (ii) 0 parts APGE curing agent.

Figure 1:
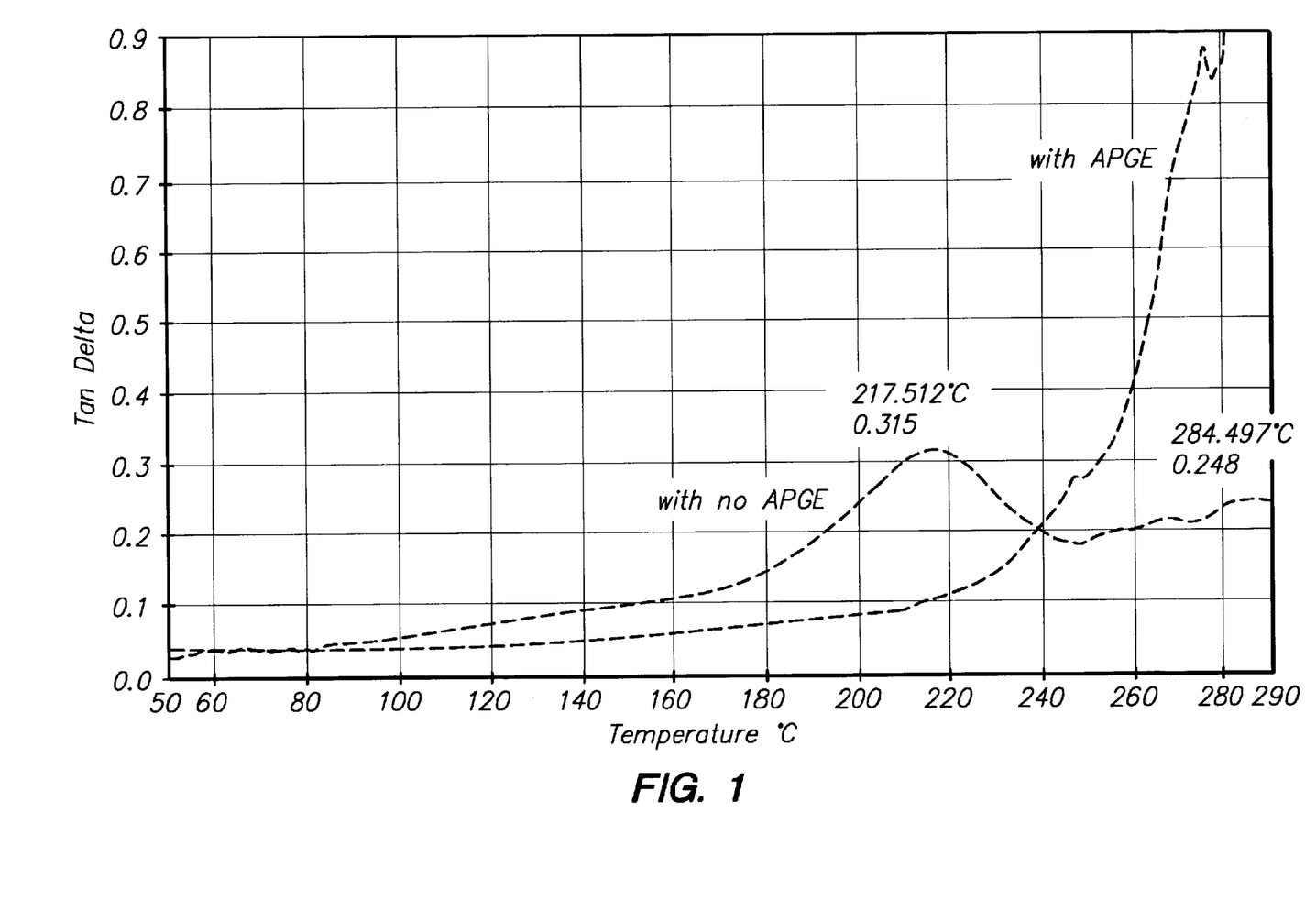
FIG. 1 are tan delta dynamic mechanical analyzer (DMA) scans from two resin mixtures showing the glass transition temperatures of two test resin mixes, one with and one without the co-curing agent APGE.

For clarity in this demonstration, the epoxy resin was omitted. The mixtures were cured in accordance with the following cure cycles: 125° C. for 2 hours, 150° C. for 1 hour, 175° C. for 2 hours, 200° C. for 2 hours, and then 250° C. for 2 hours. No attempt was made to optimize the cure cycles. After the first cure period at 125° C., a homogenous, transparent solid was observed. Dynamic mechanical analysis (DMA) scans of tan delta of the two cured compositions are in FIG. 1. Note that without the APGE, the glass transition temperature is bifurcated, whereas the APGE-containing sample has a single high glass transition. This suggests that the APGE is acting as a bridge between the cyanate ester and the bismaleimide. Without the APGE, the two DMA peaks suggest the presence of two independent interpenetrated polymer networks. However, with the APGE, these two networks are apparently bridged together, forming one single polymer with a single high glass transition.

Example 4

Cured Resin Composition 2

To demonstrate thermal characteristics, two resin mixtures were prepared and they included:

1. 3 molar equivalent parts epoxy resin (SU-3 from Exxon).

2. 6 molar equivalent parts B-10 cyanate ester resin from Ciba-Geigy.

3. 0.5 molar equivalent parts 1,1-(methylene di-4,1-phenylene)) bismaleimide from Aldrich.

4. (i) 0.5 molar equivalent parts 2-allyl phenyl glycidyl ether, or (ii) 2,2'-diallyl bisphenol A diepoxide co-curing agent.

5. 0.5 cyanate weight percent of copper (II) acetyl acetonate catalyst.

Figure 2:
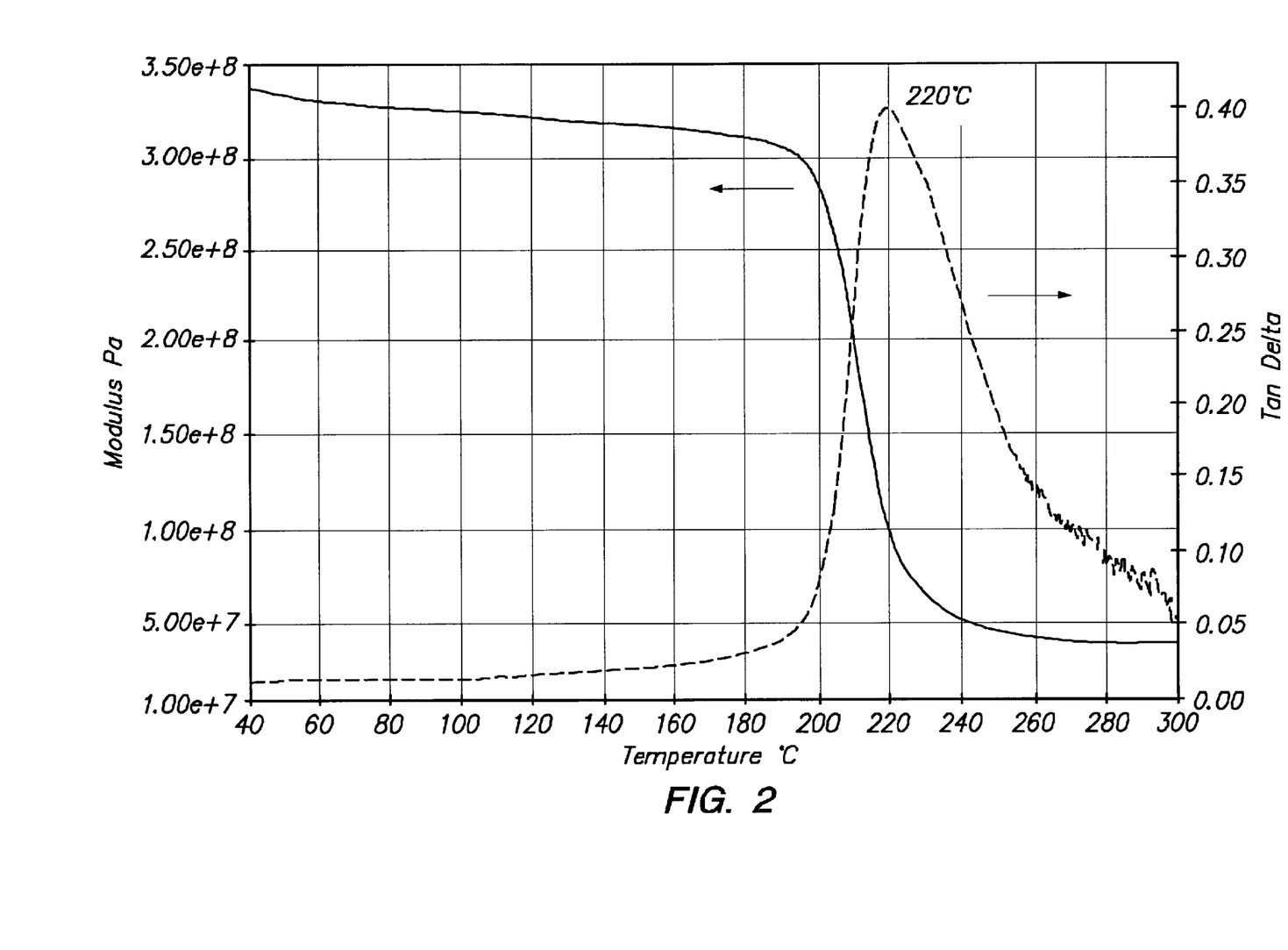
FIG. 2 is the thermogravimetric scans for a cyanate ester-bismaleimide-epoxy resin mixture with APGE.
Figure 3:
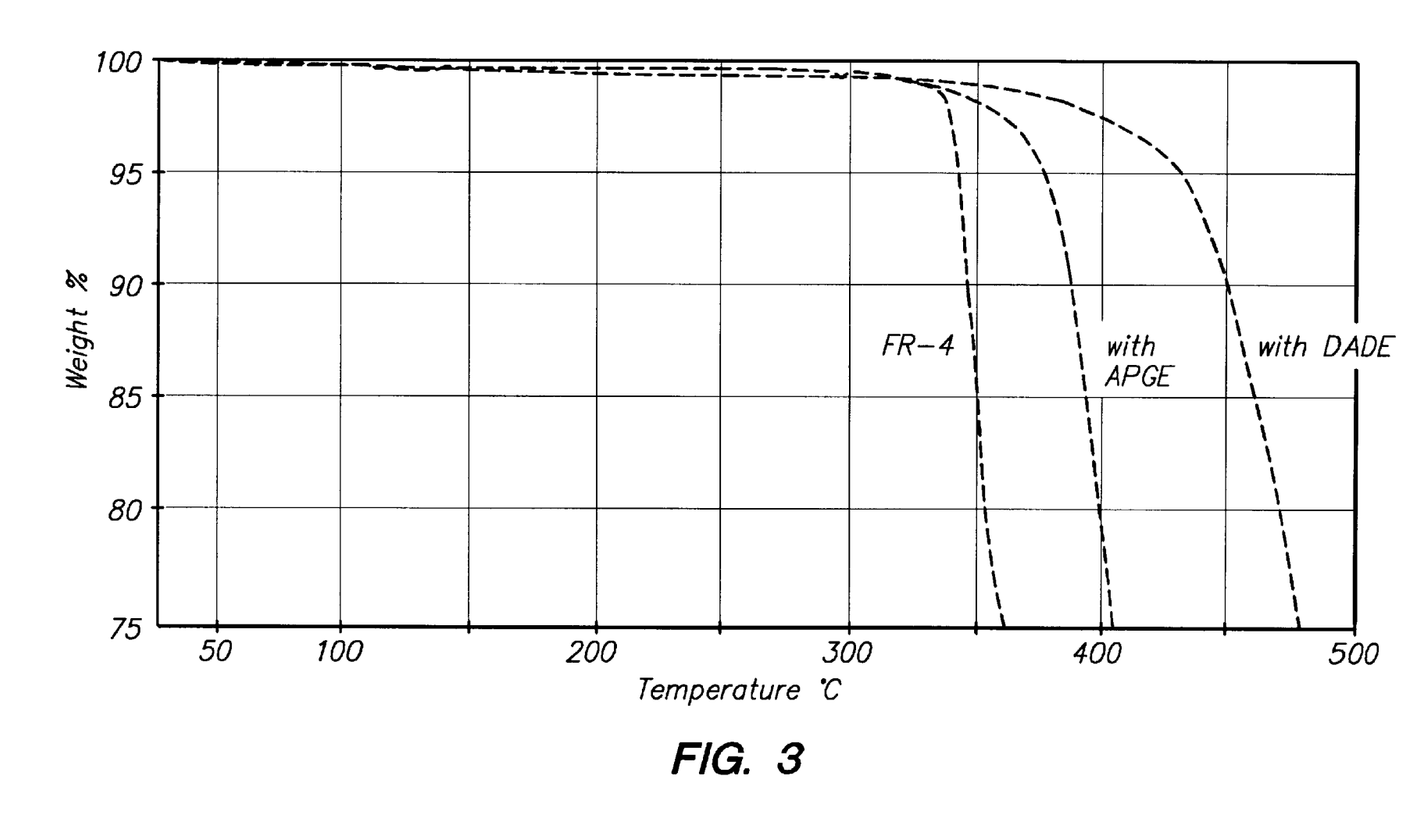
FIG. 3 are thermal decomposition weight loss scans for (i) resins having APGE (ii) resins having DADE, and (iii) FR-4 epoxy laminate.

The non-optimized curing cycle for the two mixtures was: 2 hour at 125° C., 2 hours at 150° C., 1 hour at 175° C., 2 hours at 200° C. DMA scans of tan delta for the APGE mixture are shown in FIG. 2, indicating this mixture had a glass transition at 220° C. The DMA scans of the DADE mixture were very similar. FIG. 3 shows the thermogravimetric scans for the two resins, compared with epoxy FR-4 glass laminate. As is apparent, the glass transition of the FR4 occurs at less than 150° C. The resins clearly deliver superior thermal properties compared to conventional epoxy resin.

Example 5

Cured Resin Composition 3

To demonstrate thermal characteristics of high epoxy-content resin compositions, a resin mixture was made with the following components:

1. 5 molar equivalent parts epoxy resin (SU-3 from Exxon).

2. 4 molar equivalent parts B-10 cyanate ester resin from Ciba-Geigy.

3 0.5 molar equivalent parts 1,1-(methylene di-4,1-phenylene)) bismaleimide from Aldrich.

4. 0.5 molar equivalent parts 2,2'-diallyl bisphenol A diglycicyl ether (DADE) curing agent.

5. 0.5 cyanate weight percent of copper (II) acetyl acetonate catalyst.

Figure 4:
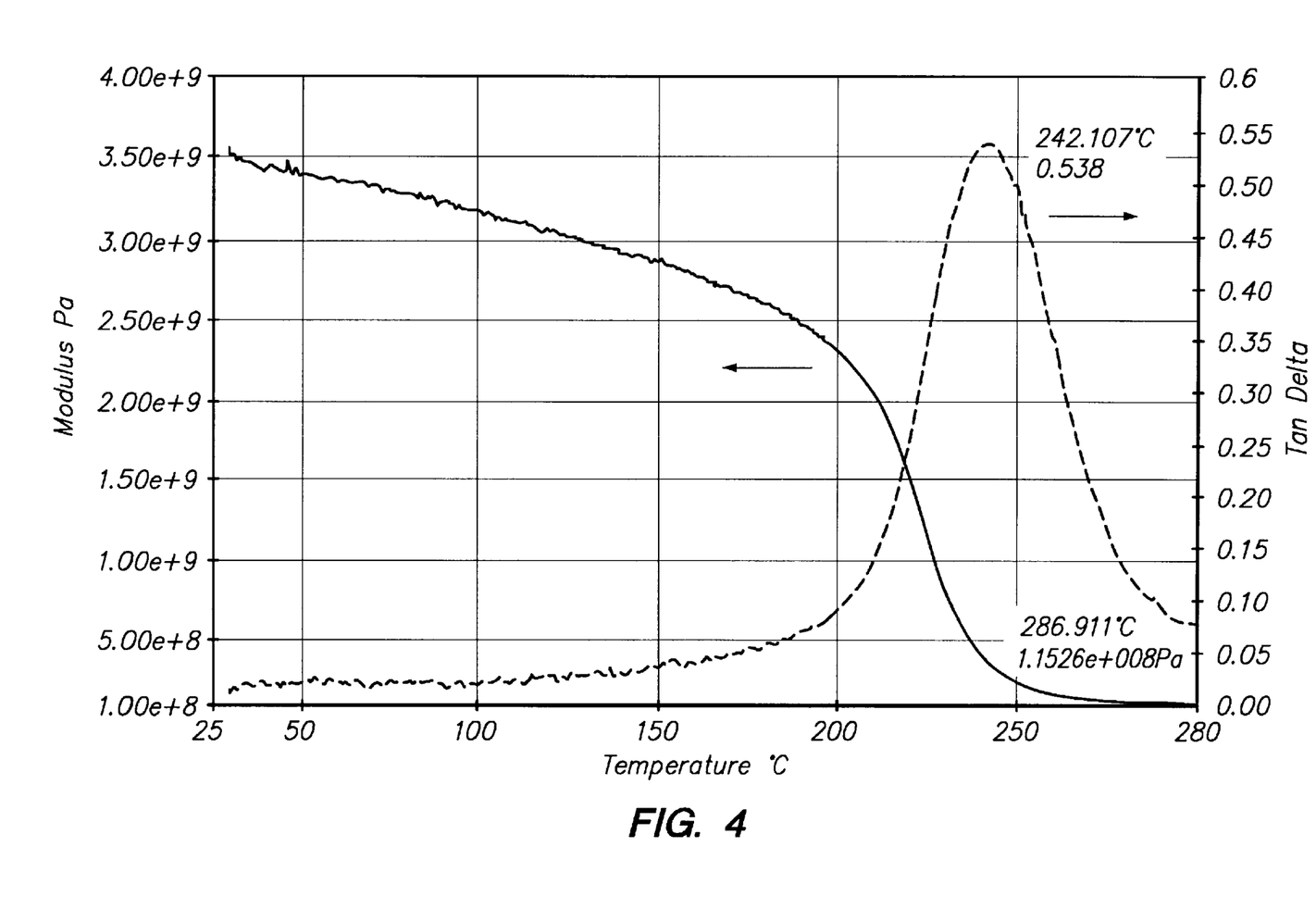
FIG. 4 is the DMA scan of an inventive resin composition.

The curing cycle for the mixture was: 2 hours at 125° C., 2 hours at 150° C., 1 hour at 175° C. and 2 hrs at 200° C. In FIG. 4, dynamic mechanical analyzer scans of the cured composition indicate that the glass transition temperature is 242° C.

Example 6

Cured Resin Composition 4

In this example, the bismaleimide and APGE were "pre-staged" to minimize loss of the APGE during curing. Equimolar quantities of CIBA 5292A and APGE were pre-mixed. This mixture was co-reacted in a metal can for four hours in a forced-air oven, at about 113° C. with continual stirring to produce the bismaleimide-APGE co-reactant. The 113° C. temperature was selected to insure safety when staging large batches of this combination of reactants. During this period the initially heavy slurry was transformed to a still heterogeneous but much lower viscosity condition. After cooling to room temperature, the slurry readily dissolved in cyanate resin mixed with epoxy resin. No precipitation of the bismaleimide occurs upon mixing. The mixture showed no changes in visible characteristics at room temperature over long periods of time.

A resin composition was mixed with the following molar proportions:

1. 5 molar equivalent parts epoxy resin (Shell Epon 826B).

2. 4 molar equivalent parts B-10 cyanate ester resin from Ciba-Geigy.

3. 4 molar equivalent parts B-30 cyanate ester resin from Ciba-Geigy.

4. 1 molar equivalent part of the bismaleimide-APGE co-reactant produced above.

5. 0.5 cyanate weight percent of copper (II) acetyl acetonate catalyst.

To establish acceptable thixotropy, a flow control agent, CABOSIL PTG (a high-surface area silica) was added. For coupling the resin matrix to the particulate surface, a surface finish agent for the flow control agent, Z-6040 (Dow Corning), was also employed. The finish agent is an epoxy-containing monomer which couples the silica through the epoxy by co-reacting with the cyanate groups in the resin. To the above mixture was added 5 wt % CABOSIL PTG followed by an additional 0.5 wt % of Dow Z-6040 epoxy silane (trimethoxyglycidoxypropyl silane). A high-shear blender was used to disperse the powder. The final composition consisted of a thixotropic paste that could be readily screen printed through a 100 mesh screen.

Figure 5:
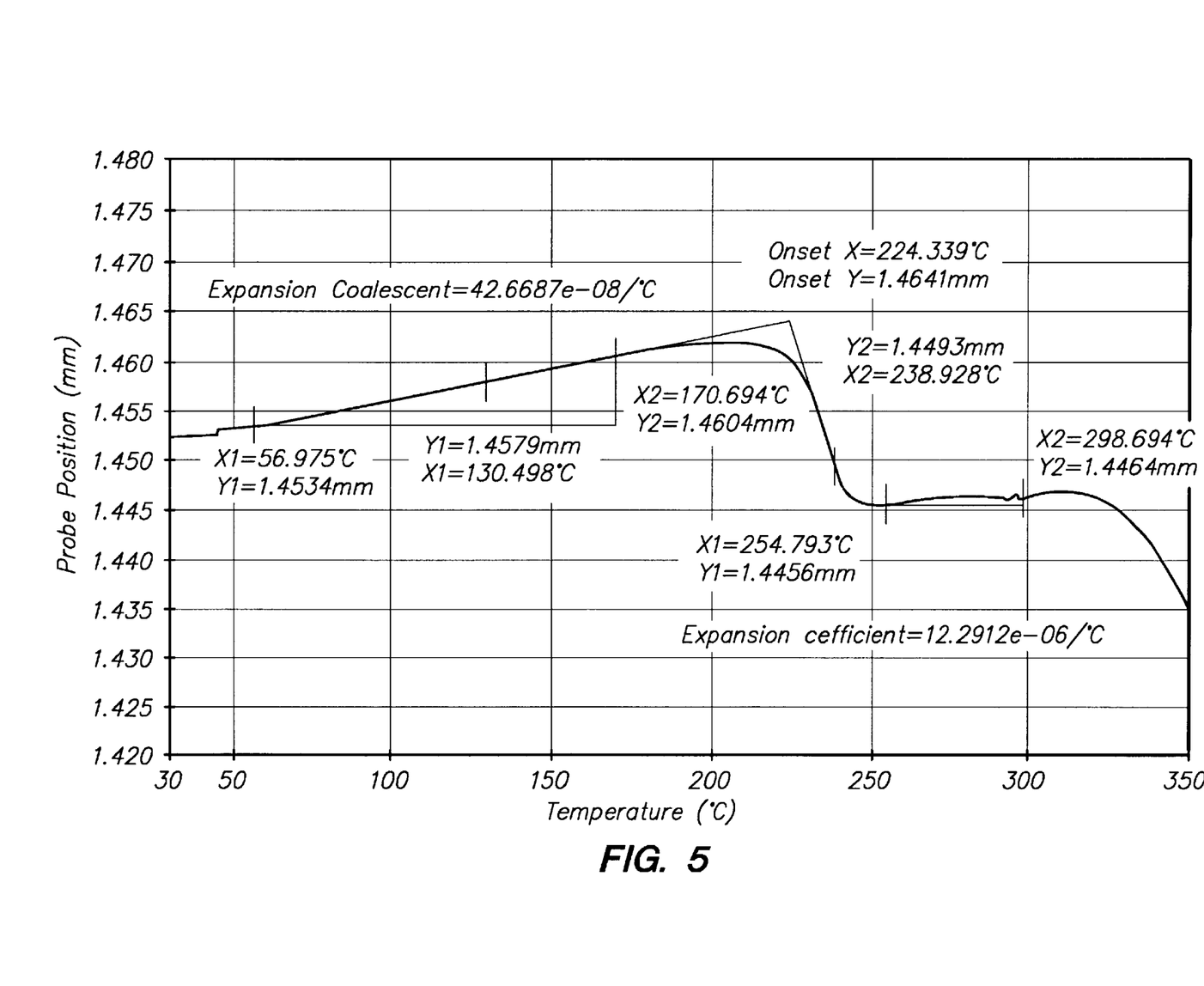
FIG. 5 is the DMA scan of an inventive resin composition.
Figure 6:
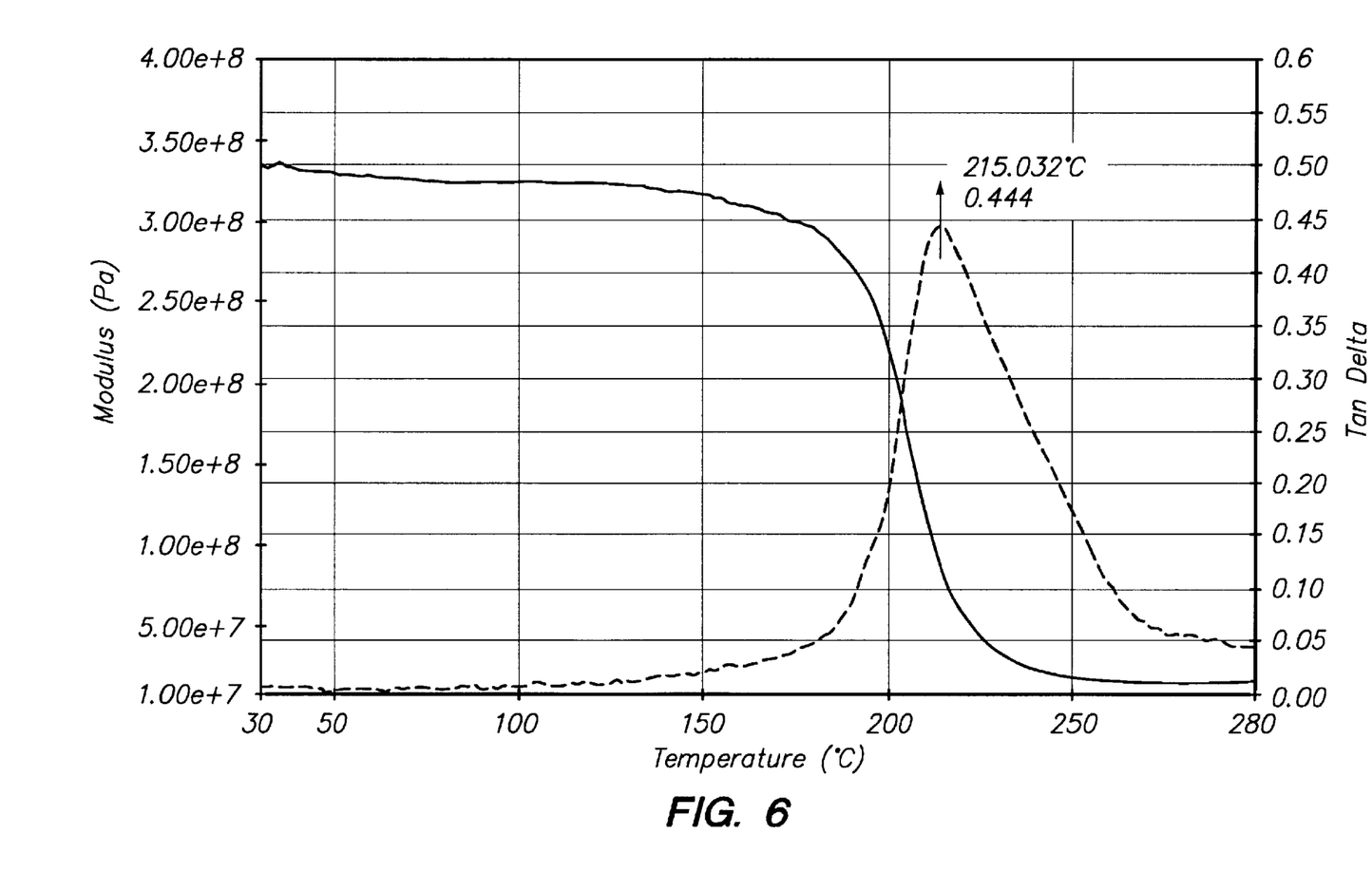
FIG. 6 is the thermal mechanical analyzer scan of same inventive resin composition of FIG. 5.
Figure 7:
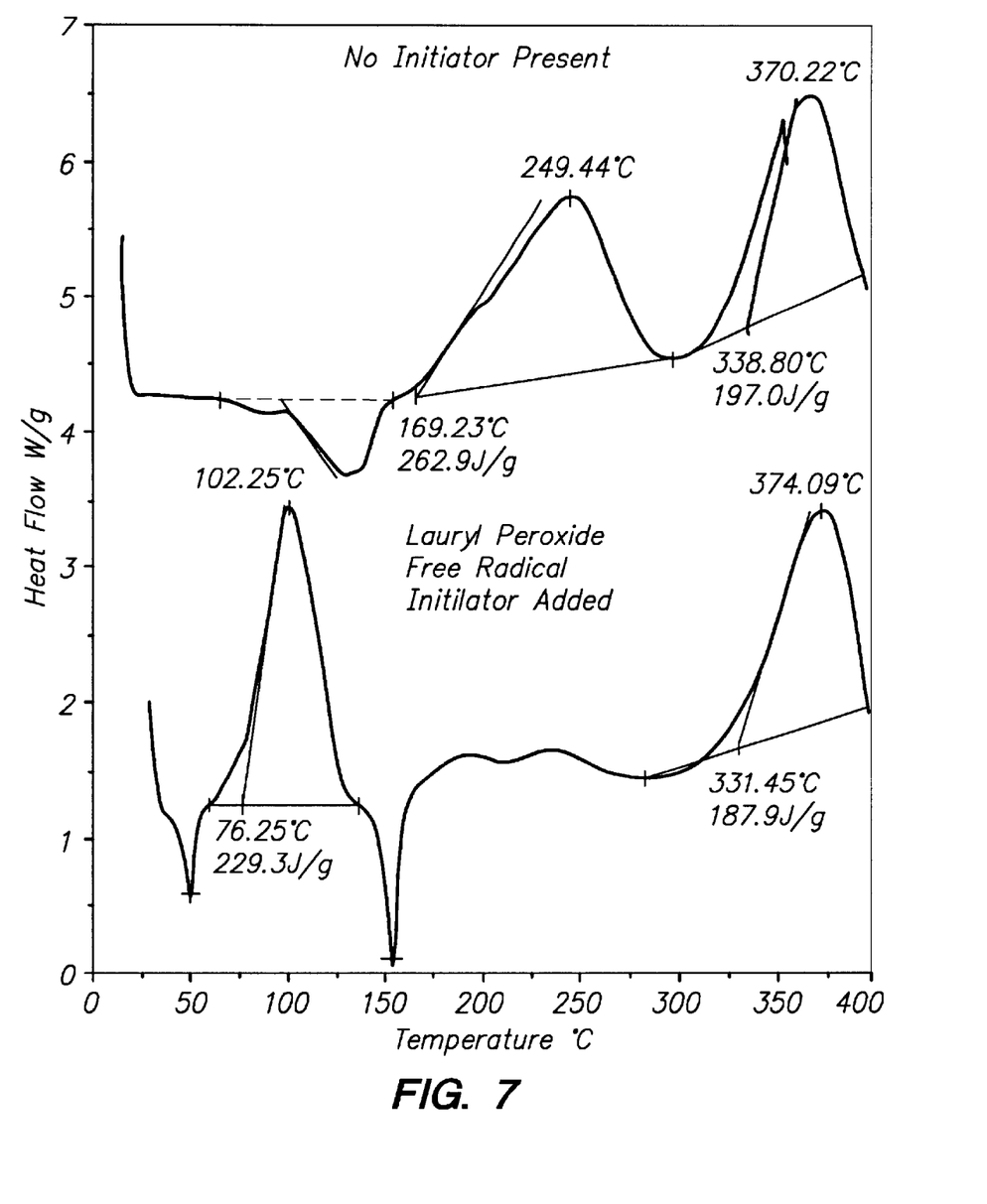
FIG. 7 are differential scanning calorimetry scans of bismaleimide-co-curing agent mixtures with and without a free-radical initiator.

The curing cycle for the mixture was: 2 hours at 125° C., 2 hours at 175° C., 2 hours at 200° C. then 1 hour at 225° C. and finally 1 hour at 250° C. In FIG. 5, dynamic mechanical analyzer scan of the composition indicates that the glass transition temperature is 213° C. In FIG. 6, the cured resin's thermal mechanical analyzer scan is shown to have a coefficient of expansion of about 42 ppm/° C. below the glass transition temperature.

The paste produced in this example was screen printed onto a silicon wafer with a 100 mesh screen and cured per the above cure cycle. The resultant encapsulant was observed to encapsulate the wafer uniformly and without voids or bubbles.

Example 7

Cured Resin Composition 5

Depending on the initiator used, the reactions between bismaleimide and the co-curing agent allyl groups can occur at as low as 100° C. To demonstrate the effect of heat initiated free-radical initiators, two representative resin mixtures were made, one containing a free-radical initiator and the other without. The resin compositions of the mixtures included:

1. 1 molar equivalent part 1,1-(methylene di-4,1-phenylene)) bismaleimide from Aldrich.

2. (i) 1 molar equivalent part 2-allyl phenyl glycidyl ether in mixture 1 or

(ii) 2,2'-diallyl bisphenol A diglycidyl ether (DADE) in mixture 2.

3. (i) 1 wt % lauryl peroxide free radical initiator in mixture 1 and

(ii) no peroxide in mixture 2.

To simplify the differential scanning calorimetry (DSC) data and demonstrate the free radical's effect clearly, other resin components were omitted. FIG. 6 illustrates the effect of the free radical. The top DSC scan is for the mixture without the free radical initiator while the bottom scan is for the mixture with the initiator. Comparing the two scans, the second exotherm that peaks at about 370° C. in the top scan is observed to be unaffected by the free radical by appearing in both scans. However, the two exotherms that peak at about 250° C. in the upper scan have disappeared and have been replaced with a new exotherm at 102° C. in the bottom scan. The lower temperature exotherms in both scans are attributed to the polymerization of the bismaleimide through its unsaturated carbon double bonds with itself and with the allyl groups in DADE. The significant shift in the polymerization temperature for this reaction is due to the free radical initiator. Using other peroxides that trigger at higher temperatures, it was observed that this exotherm peak shifts according to the initiator's trigger temperature.

Example 8

Cured Resin Composition 6

In free radical photocurable resin compositions, the photoinitiator absorbs UV radiation followed by a subsequent reaction to give a free-radical initiator. A photoinitiator, IRACURE 369 from Ciba Specialty Chemical, was mixed with a representative resin mixture that included:

1. 2 molar equivalent parts epoxy resin (SU-3 from Exxon).

2. 3 molar equivalent parts B-10 cyanate ester resin from Ciba-Geigy.

3. 1 molar equivalent part 1,1-(methylene di-4,1-phenylene)) bismaleimide from Aldrich.

4. 1 molar equivalent part 2-allyl phenyl glycidyl ether or 2,2'-diallyl bisphenol A diepoxide co-curing agent.

5. 5 weight % IRACURE 369 from Ciba Specialty Chemical.

A thin layer of the photosensitive resin composition from a chloroform solution (i.e., 2 ml/2 g concentration) was applied to an epoxy printed circuit boards. The thickness of the layer was not carefully controlled, but was about 0.001 in thick. After exposure through a mask to a long wave UV lamp (100 Watt) for 15 minutes or so at a distance of about 1 inch, the "image" was developed by using either an acetone/water mixture (5 volume parts acetone to 1 volume part water) or a saturated aqueous solution of sodium carbonate. The edge of the exposed to unexposed region was readily discernable in the resin.

The developed resin was dried and post cured at 125° C. for 2 hours followed by 175° C. for 2 hours. The curing was monitored by Fourier Transform Infrared (FTIR) spectroscopy, observing the allyl group peak at 915 cm$^{-1}$ and the imide group peak at 1700 cm$^{-1}$ to diminish. The resultant resin was gelled and the edge of the exposed regions were clearly discernable.

Figure 8:
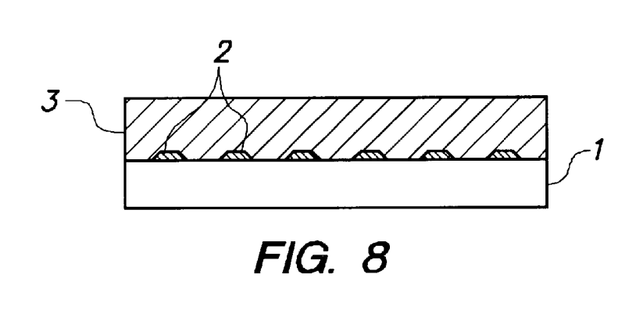
FIGS. 8, 9, and 10 illustrate encapsulation of an electronic device with a resin composition.
Figure 9:
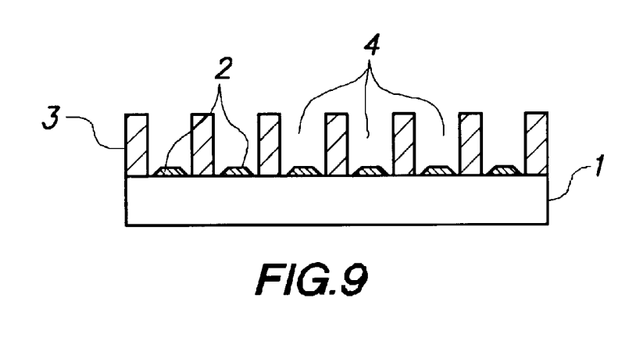
Figure 10:
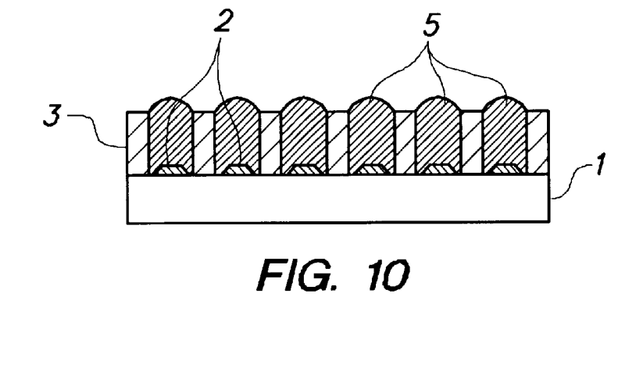

Preferred applications for the inventive resin composition are illustrated in FIGS. 8–13. FIG. 8 shows a flip chip or ball grid array device 1 which has electrical interconnection pads 2 on its surface. The pads are encapsulated with a layer of the inventive resin 3. Microvias 4 are created in the encapsulating resin layer 3 to expose the electrical interconnection pads 2 as shown in FIG. 9 and FIG. 10 shows that the microvias have been filled with electrically conductive interconnect material 5 e.g., solder.

Figure 11:
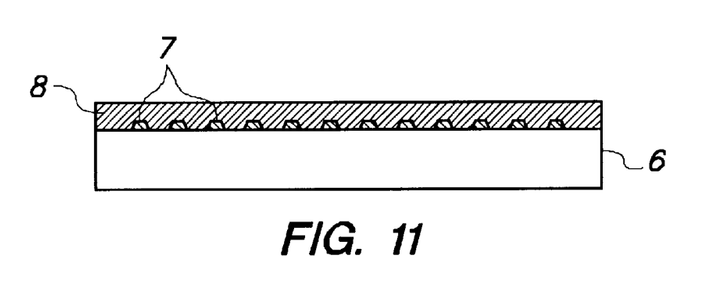
FIGS. 11, 12, and 13 illustrate encapsulation of a printed circuit board with a resin composition.
Figure 12:
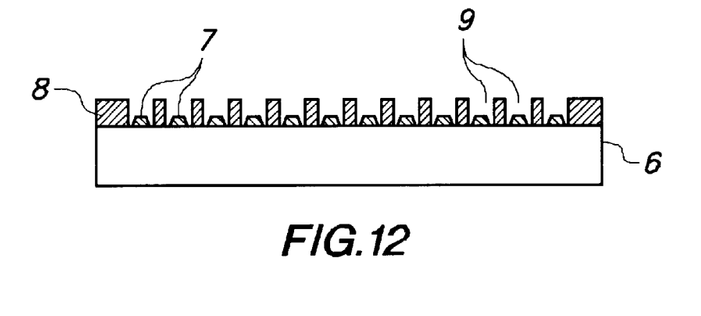
Figure 13:
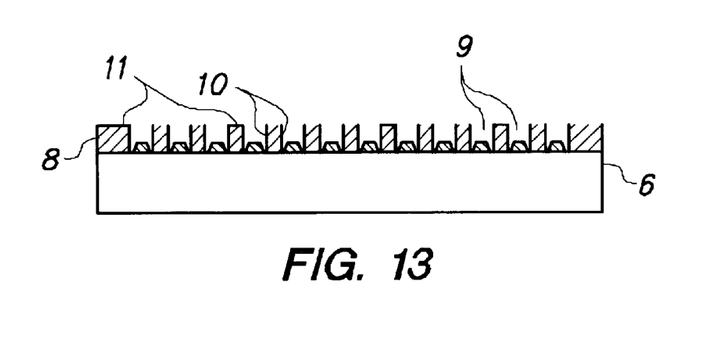

FIG. 11 shows a printed circuit board 6 having electrical interconnections pads 7 where the board 6 is encapsulated with a layer of the inventive resin composition 8. FIG. 12 the presence of microvia openings 9 in the encapsulating resin layer to expose the electrical interconnection pads 6. Finally, FIG. 13 shows the printed circuit board 6 wherein the microvias 9 and surface of the encapsulant 8 have been plated with electrically conductive interconnect material 10 e.g., copper. As illustrated the device has a patterned of the electrically conductive interconnect material that produces selected electrical interconnections between various microvias 11.

Although only preferred embodiments of the invention are specifically disclosed and described above, it will be appreciated that many modifications and variations of the present invention are possible in light of the above teachings and within the purview of the appended claims without departing from the spirit and intended scope of the invention.

What is claimed is:
1. A process of forming vias in a polymer composition comprising the steps of:
   (a) applying a layer of a resin composition that comprises
      (i) a cyanate ester;
      (ii) a bismaleimide;
      (iii) a co-curing agent having the structure R$^1$—Ar—R$^2$ wherein Ar is at least one aryl moiety, R$^1$ is at least one unsaturated aliphatic moiety, R$^2$ is at least one glycidyl moiety;
      (iv) an epoxy resin; and
      (v) a radiation triggered free-radical initiator;
   (b) covering the layer of resin composition with a mask having windows through which radiation can be transmitted;
   (c) exposing part of the resin composition to radiation to at least partially cure the resin composition in exposed areas;
   (d) removing non-cured portions of the resin composition; and
   (e) completing the cure of the resin composition.

2. The process of claim 1 wherein the co-curing agent is selected from the group consisting of compounds having the structures I and II:

wherein each of R$^3$ and R$^4$ are each selected from H, —CH$_3$ or CF$_3$ and mixtures thereof.

3. The process of claim 1 wherein the co-curing agent is selected from the group consisting of 2-allyphenyl glycidyl ether, 2,2'-diallybisphenol A diglycidyl ether, and mixtures thereof.

4. The process of claim 1 the cyanate ester is selected from the group consisting of compounds having the structures I, II and III:

wherein X is a divalent moiety, and mixtures thereof.

5. The process of claim 1 wherein the cyanate ester is wherein n is an integer from 0 to 200.

6. The process of claim 1 wherein the resin composition does not include a solvent.

7. The process of claim 1 wherein the epoxy resin is selected from the group consisting of bisphenol A based epoxy resin, bisphenol F based epoxy resin, epoxy novolac, epoxy cresol novolac, triphenylomethane triglycidyl ether, N,N-diglycidyl-4-glycidyloxyaniline, and 4,4'-methylenebis (N,N-diglycidylaniline).

8. The process of claim 1 wherein the resin composition comprises a heat triggered initiator.

9. The process of claim 1 further comprising a cyanate ester trimerization catalyst.

10. The process of claim 1 wherein the cyanate ester comprises about 1.5 to 5 molar equivalent parts of the composition, the bismaleimide comprises about 0.5 to 1.5 molar equivalent parts of the composition, the co-curing agent comprises about 0.5 to 1.5 molar equivalents of the composition, and the epoxy resin comprising about 1.5 to 5 molar equivalent parts of the composition.

11. The process of claim 1 wherein the epoxide molar equivalent concentration in the resin composition is equal to or less than the cyanate ester molar concentration.

12. The process of claim 1 wherein the co-curing agent molar equivalent concentration is less than the lesser of either (i) the cyanate ester molar concentration or (ii) the bismaleimide molar concentration.

13. A process of forming vias in a polymer composition comprising the steps of:
   (a) applying a layer of a resin composition that comprises:
      (i) a cyanate ester;
      (ii) a bismaleimide;
      (iii) a co-curing agent having the structure $R^1$—Ar—$R^2$ wherein Ar is at least one aryl moiety, $R^1$ is at least one unsaturated aliphatic moiety, $R^2$ is at least one glycidyl moiety;
      (iv) an epoxy resin; and
      (v) optionally, a free-radical initiator;
   (b) covering the layer of resin composition with a mask having openings through which radiation can be transmitted;
   (c) exposing part of the resin composition to radiation to at least partially cure the resin composition in exposed areas;
   (d) removing non-cured portions of the resin composition; and
   (e) completing the cure of the resin composition.

14. The process of claim 13 wherein the co-curing agent is selected from the group consisting of compounds having the structures I and II:

wherein each of $R^3$ and $R^4$ are each selected from H, —$CH_3$ or $CF_3$ and mixtures thereof.

15. The process of claim 13 wherein the co-curing agent is selected from the group consisting of 2-alyphenyl glycidyl ether, 2,2'-diallybisphenol A diglycidyl ether, and mixtures thereof.

16. The process of claim 13 the cyanate ester is selected from the group consisting of compounds having the structures I, II and III:

wherein X is a divalent moiety, and mixtures thereof.

17. The process of claim 13 wherein the cyanate ester is wherein n is an integer from 0 to 200.

18. The process of claim 13 herein the resin composition does not include a solvent.

19. The process of claim 13 wherein the epoxy resin is selected from the group consisting of bisphenol A based epoxy resin, bisphenol F based epoxy resin, epoxy novolac, epoxy cresol novolac, triphenylomethane triglycidyl ether, N,N-diglycidyl-4-glycidyloxyaniline, and 4,4'-methylenebis (N,N-diglycidylaniline).

20. The process of claim 13 wherein the resin composition comprises the free radical initiator which is a heat triggered initiator.

21. The process of claim 13 further comprising a cyanate ester trimerization catalyst.

22. The process of claim 13 wherein the cyanate ester comprises about 1.5 to 5 molar equivalent parts of the composition, the bismaleimide comprises about 0.5 to 1.5 molar equivalent parts of the composition, the co-curing agent comprises about 0.5 to 1.5 molar equivalents of the composition, and the epoxy resin comprising about 1.5 to 5 molar equivalent parts of the composition.

23. The process of claim 13 wherein the epoxide molar equivalent concentration in the resin composition is equal to or less than the cyanate ester molar concentration.

24. The process of claim 13 wherein the co-curing agent molar equivalent concentration is less than the lesser of either (i) the cyanate ester molar concentration or (ii) the bismaleimide molar concentration.

* * * * *